US005784770A

United States Patent [19]

Long, Jr. et al.

[11] Patent Number: 5,784,770

[45] Date of Patent: Jul. 28, 1998

[54] WIRE FEED AND POSITIONING UNIT

[75] Inventors: Alden Owen Long, Jr., Carlisle; Douglas Sebastian Pfautz, Landisville, both of Pa.

[73] Assignee: The Whitaker Corporation, Wilmington, Del.

[21] Appl. No.: 921,107

[22] Filed: Aug. 29, 1997

Related U.S. Application Data

[63] Continuation of Ser. No. 707,166, Aug. 30, 1996, abandoned.

[51] Int. Cl.[6] .......... H01L 43/04

[52] U.S. Cl. .......... 29/564.4; 29/33 M; 29/753

[58] Field of Search .......... 29/33 M, 564.4, 29/745, 751, 753, 748, 566.3; 226/112, 24, 115; 140/1

[56] References Cited

U.S. PATENT DOCUMENTS

| | | | |
|---|---|---|---|
| 3,086,282 | 4/1963 | Cootes et al. | 29/155.55 |
| 3,556,372 | 1/1971 | Barnes et al. | 226/115 |
| 3,612,111 | 10/1971 | Meyer | 140/1 |
| 3,612,369 | 10/1971 | Grebe et al. | 226/24 |
| 4,584,912 | 4/1986 | Gudmestad et al. | 29/33 M X |
| 4,596,174 | 6/1986 | LaFleur | 226/112 X |
| 5,025,549 | 6/1991 | Hornung et al. | 29/564.4 |
| 5,060,395 | 10/1991 | Pepin | 29/33 M |

FOREIGN PATENT DOCUMENTS 0 365 137 4/1990 European Pat. Off. .

OTHER PUBLICATIONS

International Search Report, Applicant's reference No. 16696 PCT, International Application No. PCT/US 97/14809, International Filing Date: Aug. 22, 1997.

*Primary Examiner*—William R. Briggs
*Attorney, Agent, or Firm*—Marshall E. Rosenberg

[57] ABSTRACT

A mechanisms (18) is disclosed for feeding electrical wire (24) in a lead making machine (10) and for positioning the end of the wire with respect to an applicator press (14) for termination. The mechanism includes a wire feed unit (42) mounted on a platform (40) that is pivotable from a position adjacent a wire cutting and stripping unit (34) and a position adjacent the applicator press (14). Two concentric drive shafts are provided, the outer shaft (44) being hollow and the inner shaft (62) being within the outer shaft. The inner shaft is drivingly coupled to the feed unit while the outer shaft is rigidly attached to the platform. A single actuator motor (196) drives both the inner and outer shafts (62, 44) through a coupling (204) that selectively couples to and decouples from each. The coupling includes an air cylinder (218) and two clutches 230, 232) that operate to lock one shaft in position while permitting the other shaft to be rotated by the motor.

25 Claims, 10 Drawing Sheets

WIRE FEED AND POSITIONING UNIT

This application is a Continuation of application Ser. No. 08/707,166 filed Aug. 30, 1996, now abandoned.

The present invention relates to mechanisms for feeding electrical wire in a lead making machine and for positioning the end of the wire for termination, and more particularly to a single mechanism that performs both functions.

BACKGROUND OF THE INVENTION

Machines for making electrical leads of the type referred to as in-line machines, include a wire feed mechanism for feeding wire along a straight horizontal wire feed path. The wire feed path extends through upstream and downstream wire transfer mechanisms and a wire cutting and stripping unit. Termination presses are positioned on one or more sides of the wire feed path for terminating one or both ends of the cut wire lead. In normal use, assuming that a lead has been previously processed, the wire is feed through the two transferring mechanism, including the wire cutting and stripping unit, until the desired length of the lead extends beyond the cutting blades. The cutting and stripping unit is then actuated to sever the wire and to strip insulation from the two cut ends. Each of the transfer mechanisms then pivots its respective wire end over to a terminating press for the application of a terminal thereto, as desired. A lead making machine of this general type is disclosed in U.S. Pat. No. 5,025,549 which issued Jun. 25, 1991 to Hornung et al. and is incorporated herein by reference. The transfer mechanisms of this machine are quite complex and have separate drive systems for wire feed and for wire positioning at the applicator presses. Such mechanisms are expensive to manufacture and to maintain. Additionally, the more complex mechanisms are more difficult to repair which can translate into longer down times for the machine wherein reliability becomes a consideration.

What is needed is a simplified mechanism that performs both the wire feed function and the positioning of the wire end to the applicator press for termination. Further, a single drive system should operate the mechanism for performing both functions.

SUMMARY OF THE INVENTION

A machine for making electrical wire leads is disclosed. The machine has a frame, a wire cutting and stripping unit attached to the frame, and a terminating unit attached to the frame. A wire handling mechanism is provided for feeding electrical wire with respect to the wire cutting and stripping unit and for positioning an end of the wire with respect to both the wire stripping unit and the terminating unit. The wire handling mechanism includes a platform coupled to the frame having a wire feed mechanism and a wire outlet through which the wire is fed upon actuation of the feed mechanism. The platform is pivotable with respect to the frame between a first position where the wire outlet is adjacent the wire stripping unit and a second position where the wire outlet is adjacent the terminating unit. There is an outer shaft having a longitudinal axis and a hole through the shaft substantially parallel to the axis. The outer shaft is arranged to pivot with respect to the frame and thereby pivot the platform between the first and second positions. An inner shaft extends through the hole, and upon rotation thereof, effects the actuation of the feed mechanism. A single actuator is attached to the frame and a coupling mechanism couples the single actuator to both the outer shaft and the inner shaft. The single actuator and coupling mechanism are arranged to selectively rotate the inner shaft while holding the outer shaft stationary with respect to the frame or to pivot the outer shaft while holding the inner shaft stationary with respect to the platform.

DESCRIPTION OF THE PREFERRED EMBODIMENT

Figure 1:
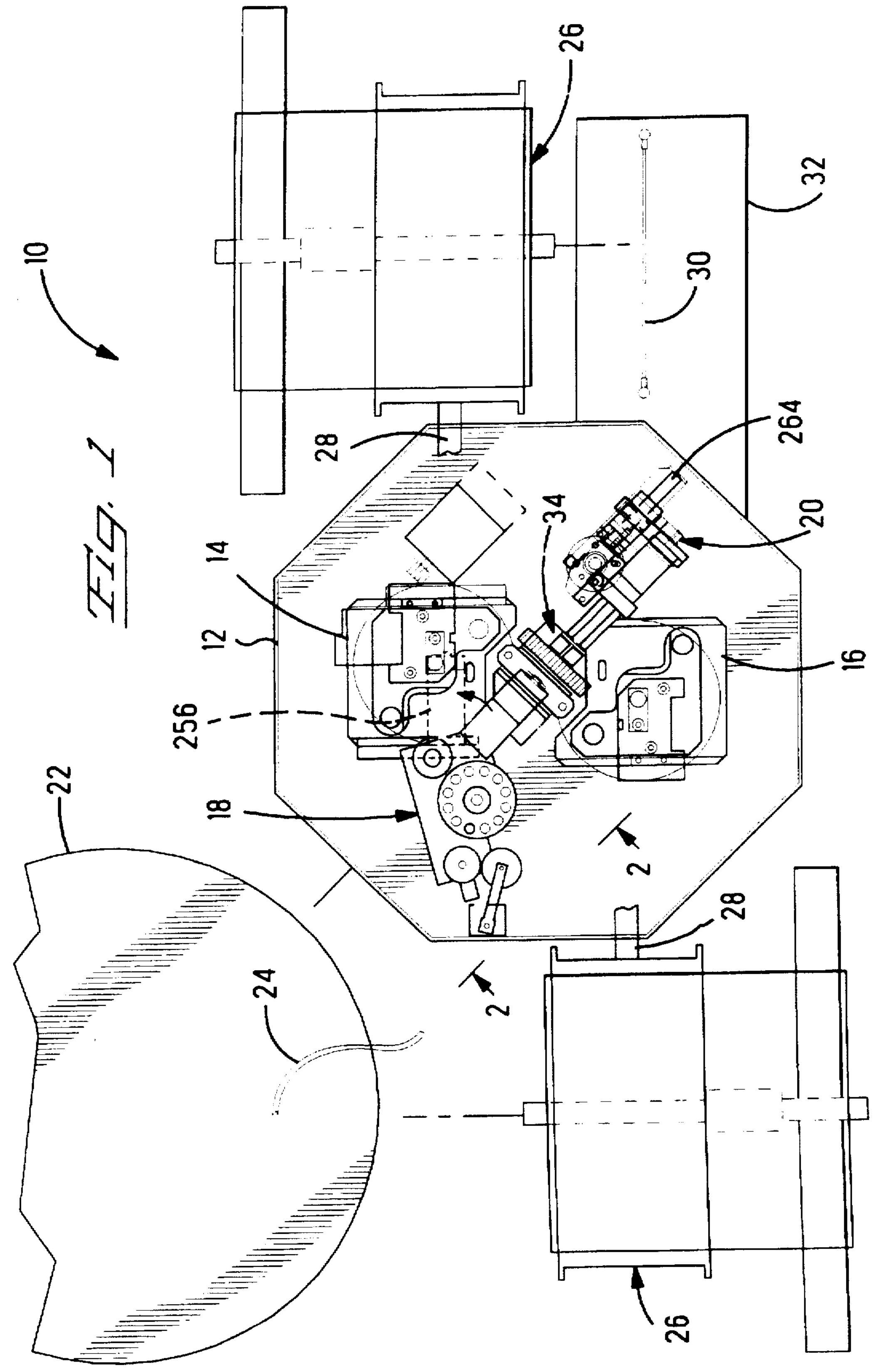
FIG. 1 is a schematic representation of a plan view of a wire lead making machine incorporating the teachings of the present invention.

There is shown in FIG. 1 a machine 10 for making electrical leads. The machine 10 includes a frame 12, feed side and eject side terminating presses 14 and 16, respectively, and feed side and eject side wire feed and positioning units 18 and 20, respectively. An endless wire supply 22, in the form of a barrel in the present example, having a supply of electrical wire 24 is positioned adjacent the feed side unit 18. A dereeling unit 26 is positioned adjacent each press 14 and 16 for feeding a strip 28 of terminals to each of the presses for attachment to the ends of the wire 24 to form a lead 30. A stacking tray 32 is arranged adjacent the eject side unit 20 to receive and stack the completed leads 30. A wire cutting and stripping unit 34 is positioned between the feed side and eject side wire feed and positioning units 18 and 20.

Figure 2:
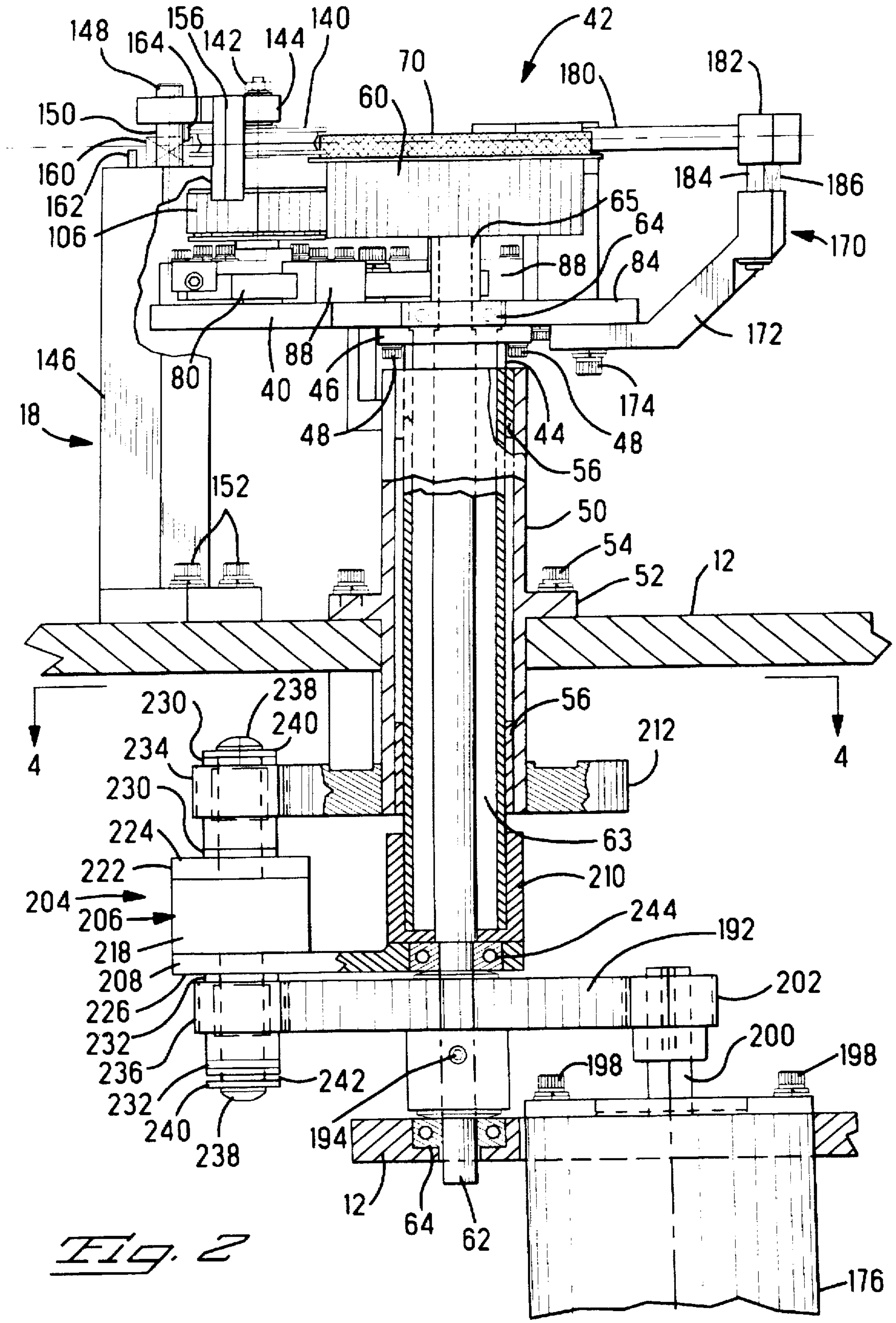
FIG. 2 is a partially sectioned view of the wire feed and positioning unit taken along the lines 2—2 in FIG. 1.
Figure 3:
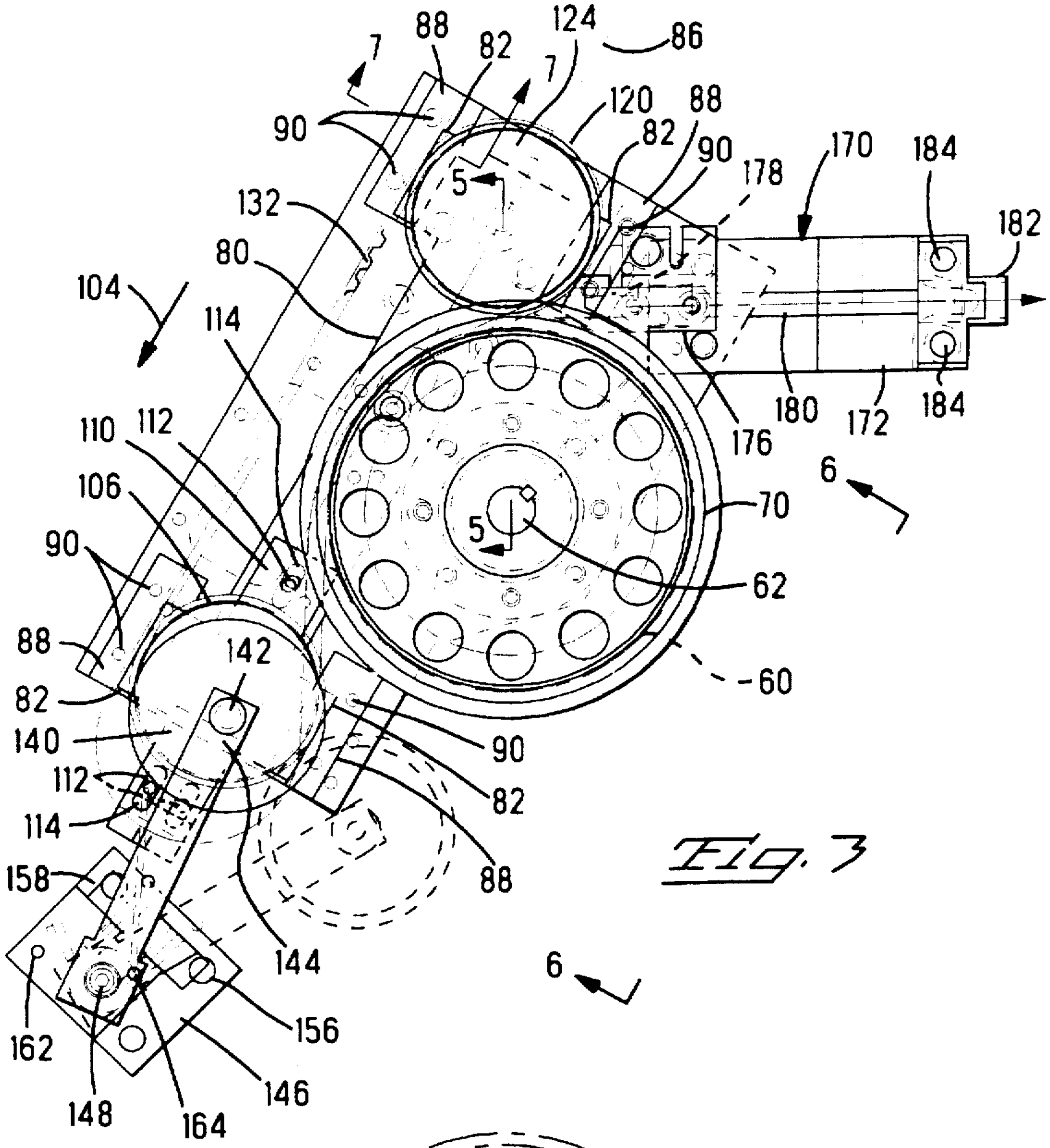
FIG. 3 is a top view of the mechanism shown in FIG. 2.

In the present example the feed side and eject side feed and positioning units 18 and 20 are similar, except as set forth below. Therefore, only the feed side unit 18 will be described in detail and, where appropriate, the structures of the unit 20 that are different will be described in general terms only. As shown in FIGS. 2 and 3, the feed and positioning unit 18 includes a platform 40 having a wire feed mechanism 42 attached thereto. The platform 40 is pivotally coupled to the machine frame 12 by means of a hollow shaft 44 having a flange 46 on one end thereof that is secured to the platform 40 with screws 48. The hollow shaft 44 extends through a sleeve 50 having a mid-position flange 52 that is secured to the frame 12 by means of screws 54. A pair of bearings 56 are arranged at each end of the bore of the sleeve 50 for pivotally supporting the hollow shaft 44, as best seen in FIG. 2.

Figure 5:
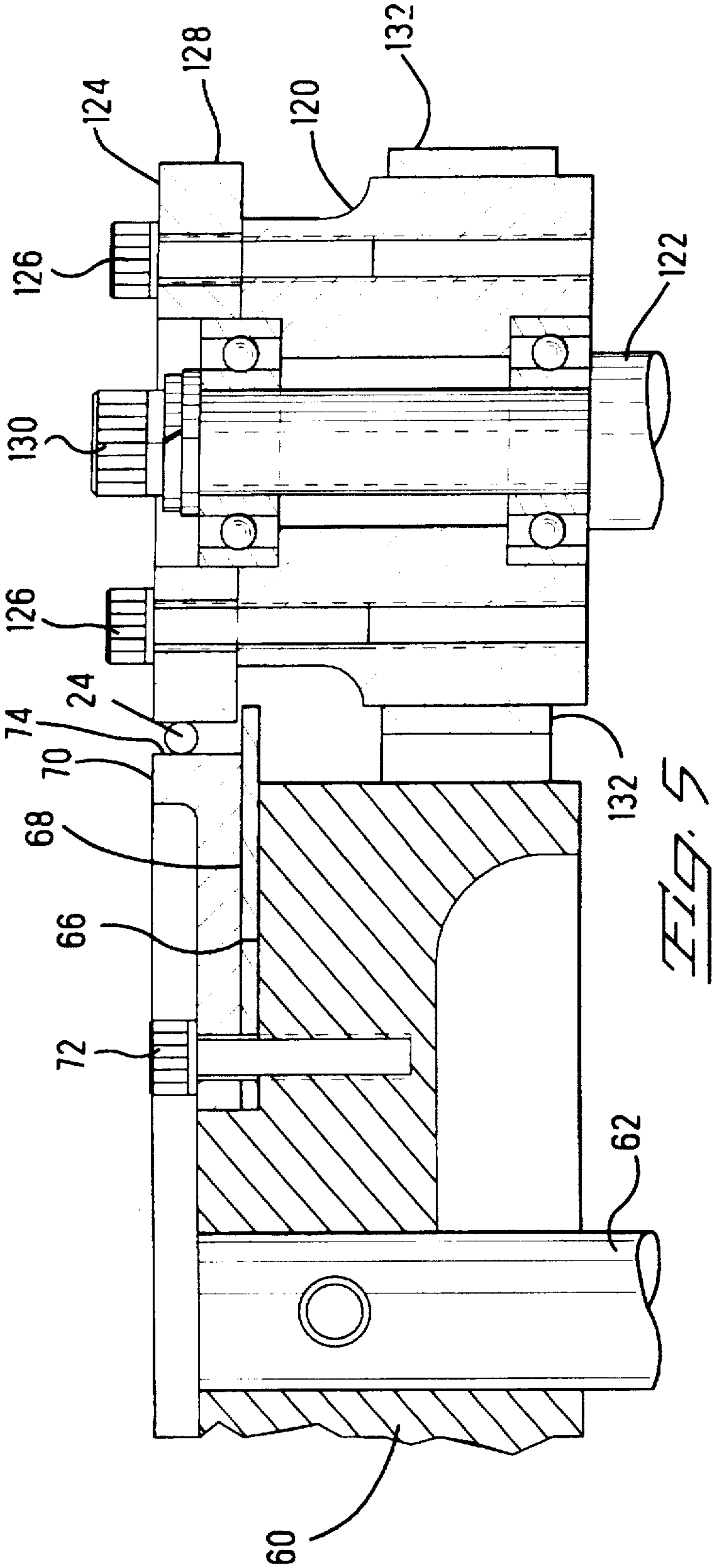
FIG. 5 is a cross-sectional view taken along the lines 5—5 in FIG. 3.
Figure 7:
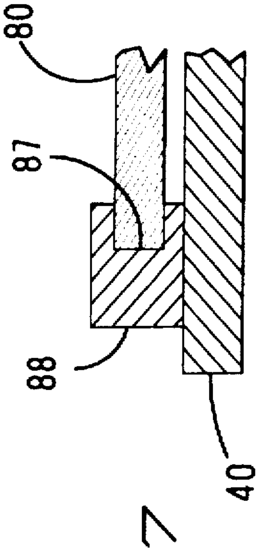
FIG. 7 is a cross-sectional view taken along the lines 7—7 in FIG. 3.
Figure 6:
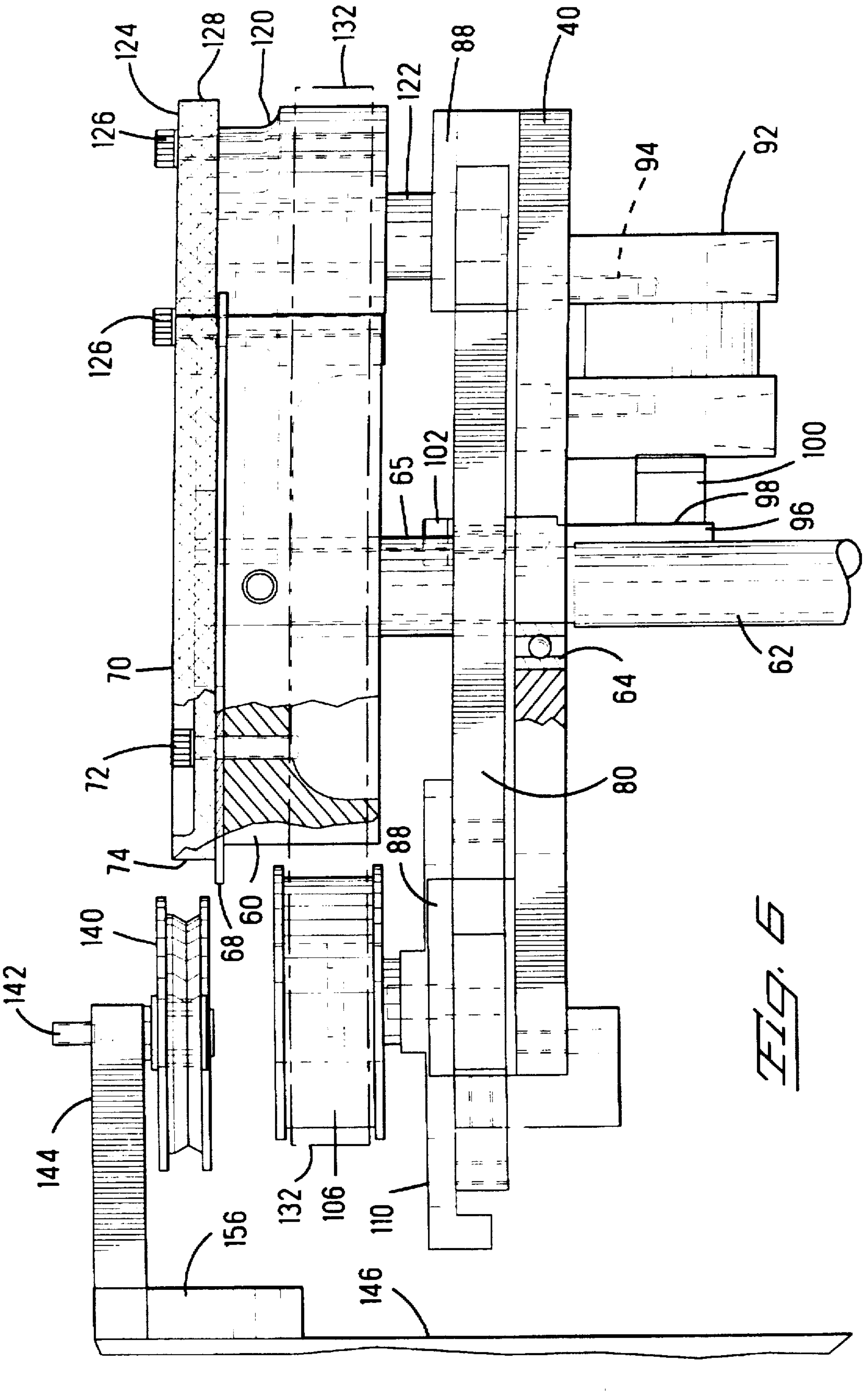
FIG. 6 is a view taken along the lines 6—6 in FIG. 3.

The wire feed mechanism 42, as shown in FIGS. 2 and 3, includes a drive pulley 60 keyed to a drive shaft 62 that is journaled for rotation in a pair of ball bearings 64, one of which is in the frame 12 near the lower end of the shaft and the other of which is in the platform 40. The drive shaft 62 extends through a spacer sleeve 65 that is between the bearing 64 in the platform and the drive pulley 60 to maintain the drive pulley in a desired position spaced from the platform 40, as best seen in FIG. 6. The drive shaft 62 extends through the interior hole 63 of the hollow shaft 44, as shown in FIG. 2. As best seen in FIG. 5, the drive pulley 60 has a recess 66, a washer 68 and a wire feed wheel 70 arranged within the recess and held in place with screws 72 that engage threaded holes in the pulley 60. The outer peripheral surface 74 is knurled for good non-slip engagement with the wire 24. The outer edge of the washer extends past the knurled surface 74 as a guard to assure that the wire 24 remains in engagement with the surface 74. An I-shaped member 80 having ears 82 extending from opposite sides of each end is in sliding engagement with slots 87 formed in Four gibs 88, as best seen in FIGS. 3 and 7. The four gibs 88 are secured to the upper surface 84 of the platform 40 by means of screws 90. The slots 87 are arranged so that the I-shaped member 80 can slide freely back and forth along an axis 86, as shown in FIG. 3. As best seen in FIG. 6, an air cylinder 92 is attached to the underside of the platform 40 by means of screws 94. A rod 96 having a flat surface 98 facing and in alignment with the piston rod 100 of the air cylinder is attached to the underside of the I-shaped member 80 by means of a screw 102 that extends through a hole in the I-shaped member and into a threaded hole in the end of the rod 96. When the air cylinder 92 is actuated the piston rod 100 pushes against the surface 98 of the rod 96, thereby causing the I-shaped member to slide along the axis 86 in the direction of the arrow 104 in FIG. 3, for a purpose that will be explained. An idler pulley 106 is journaled for rotation on a stud 108 that is attached to a slide block 110, as best seen in FIG. 6. The slide block 110 is secured to one end of the upper surface of the I-shaped member 80 by means of three screws 112, as best seen in FIG. 3, that extend through elongated holes 114 in the slide block and into threaded holes in the I-shaped member. As best seen in FIGS. 5 and 6, a driving pulley 120 is journaled for rotation on a stud 122 that is attached to the other end of the I-shaped member 80. A pressure roller 124 is attached to the hub of the driving pulley 120 by means of screws 126 and has an outer surface 128 that is knurled and in alignment with the surface 74 of the wire feed wheel 70, as best seen in FIGS. 5 and 6. The driving pulley 120 and pressure roller 124 assembly is held on the stud 122 by means of a screw 130 that is threaded into a hole in the end of the stud. A flexible timing belt 132 is disposed around the idler pulley 106, the driving pulley 120, and in driven engagement with a portion of the drive pulley 80, as best seen in FIG. 3. As the drive pulley 60 rotates in the clockwise direction, as viewed in FIG. 3 for example, the timing belt 132 causes the driving pulley 120 and attached pressure roller 124 to rotate counterclockwise. The two counter-rotating surfaces 74 and 128, having the wire 24 sandwiched therebetween, effectively feed the wire, as will be described below. Tension on the timing belt 132 is adjusted by loosening the screws 112 and moving the slide block 110 in the appropriate direction along the axis 86 and then tightening the screws again. A wire guide roller 140 is journaled for rotation on a stud 142 that is attached to one end of a radius arm 144, the other end of which is pivotally attached to a standoff post 146 by means of a shoulder screw 148 that extend through a hole in the arm 144, through a spacer sleeve 150 and into a threaded hole in the top surface of the post 146, as best seen in FIG. 2. The post 146 is secured to the frame 12 by means of screws 152. A U-shaped member 154 is attached to the side of the post 146, having its two sides 156 and 158 extending upwardly along opposite sides of the arm 144 for limiting pivotal movement thereof. A torsion spring 160 is disposed about the sleeve 150, one end of which is against a pin 162 extending from the top of the post 146 and the other end of which is against a pin 164 extending downwardly from the radius arm 144. This torsion spring urges the radius arm 144 and guide roller 140 to pivot clockwise from the position shown in solid lines toward the position shown in phantom lines in FIG. 3 for tensioning the wire 24, as will be explained below. An outlet guide assembly 170 is arranged to receive the wire 24 as it exits from between the wire feed wheel 70 and the pressure roller 124, as best seen in FIGS. 2 and 3. The outlet guide assembly includes a support arm 172 that is attached to the platform 40 by means of screws 174 that are threaded into holes in the platform and a wire guide block 176 that is fixed to a holder and support block assembly that is attached to the upper surface of the platform by screws, not shown, that extend upwardly through clearance holes in the platform and into threaded holes in the bottom of the block 176. The wire guide block includes an opening 178 that is in alignment with the exiting wire 24. The opening 178 is counterbored to tightly receive an end of a flexible tube 180, the other end of which is tightly held in a support block 182 having a pair of pins 184 extending downwardly, as viewed in FIG. 2, and into sliding engagement with holes formed in the support arm 172 so that the support block is free to move up and down with respect to the support arm. A spring 186 is disposed between the support block 182 and the support arm 172 for urging the support block upwardly to the position shown in FIG. 2 for normal feeding of the wire 24. When attaching certain types of terminals to the end of the wire 24 it is desirable to direct the wire 24 downwardly into alignment with the terminal. This is accomplished by a mechanism, not shown, that engages the top surface of the support block 182 and presses it downwardly against the upward bias of the spring 186 a desired amount.

Figure 4:
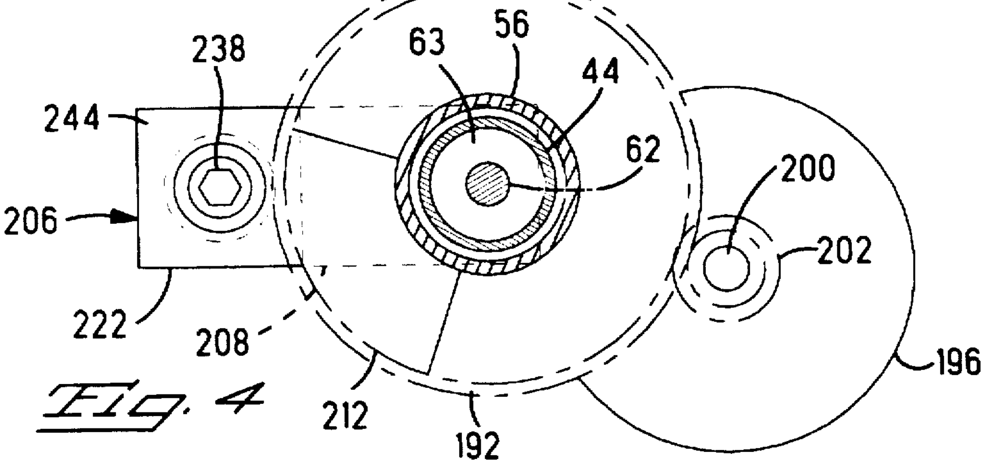
FIG. 4 is a cross-sectional view taken along the lines 4—4 in FIG. 2.

As shown in FIGS. 2 and 4, a drive gear 192 is attached to the drive shaft 62 by any suitable means such as a pin 194. A bidirectional electric motor 196 is attached to the frame 12 by means of screws 198 that engage threaded holes in the frame. The output shaft 200 of the motor has a spur gear 202 attached thereto in engagement with the drive gear 192. As the motor operates, the drive shaft 62 is caused to rotate in a desired direction. A coupling unit 204 is arranged to selectively couple the output shaft 200 of the motor to drive either the wire feed wheel 70 with respect to the platform 40 or to pivot the platform 40 to position the end of the wire 24 adjacent either the cutting and stripping unit 34 or the feed side press 14. The coupling unit 204 includes a clutch mechanism 206 that is rigidly attached to the hollow shaft 44 by means of an attachment arm 208 and clamp 210. A segment of a gear 212 is attached to the bottom of the sleeve 50, by any suitable means, so that it is held stationary with respect to the frame 12. The gear segment 212 is identical in diameter and pitch to that of the gear 192, both gears being mutually concentric, as best seen in FIG. 4.

Figure 8:
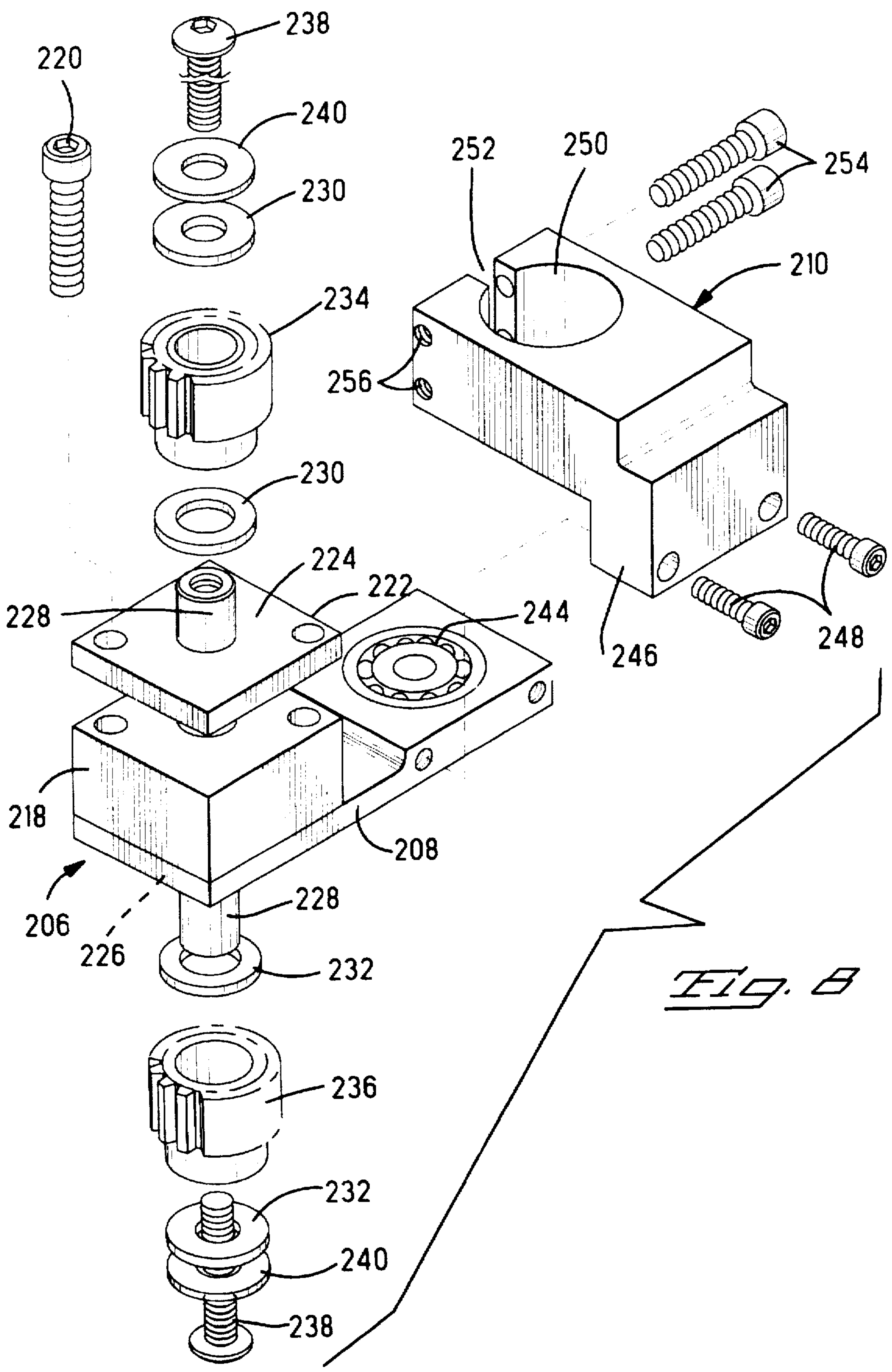
FIG. 8 is an exploded parts view of the drive coupling mechanism shown in FIG. 2.

As best seen in FIG. 8, the clutch mechanism 206 includes an air cylinder 218 attached to the attachment arm 208 by means of screws 220. A wear block 222 is arranged against a surface of the air cylinder opposite the attachment arm 208 and includes a wear surface 224 facing upwardly. The screws 220 extend through clearance holes in the wear block 222 and the air cylinder 218 and into threaded holes in the attachment arm 208 to secure the three parts together. The lower surface 226 of the attachment arm 208 that faces away from the air cylinder 218 is also a wear surface. The air cylinder 218 includes a piston rod 228 that extends upwardly and downwardly from both ends of the air cylinder, as shown in FIG. 8. Two pairs of upper and lower clutch plates 230 and 232, respectively, each being in the shape of a washer, are arranged around the two ends of the piston rod 228 so that the upper clutch plates 230 are on opposite sides of an upper spur gear 234 and the lower clutch plates 232 are on opposite sides of a lower spur gear 236. The upper and lower spur gears 234 and 236 each are journaled for rotation on the piston rod 228 and are arranged in engagement with their respective upper and lower clutch plates 230 and 232, as shown in FIG. 2. Each spur gear 234 and 236 is held captive to the piston rod by means of a screw 238 and flat steel washer 240, the screw being threaded into a hole formed in the end of the piston rod. The upper spur gear 234 is in meshing engagement with the gear segment 212 and the lower spur gear 236 is in meshing engagement with the drive gear 192. The combined thicknesses of the four clutch plates 230 and 232, the two gears 234 and 236, and flat washers 240 are chosen so that when the air cylinder 218 is pressurized so that the piston rod 228 is urged downwardly, as viewed in FIG. 2, the upper washer 240 forces the two clutch plates 230 tightly against the ends of the upper spur gear 234 trapped therebetween and forces the lower of the two upper clutch plates 230 tightly against the wear surface 224. This prevents rotation of the upper spur gear with respect to the clutching mechanism 206 and the gear segment 212. Concurrently, the lower clutch plates 232 and lower spur gear 236 have a small amount of axial play indicated by the space 242 between the lower flat washer 240 and the lower of the two clutch plates 232, as shown in FIG. 2. This permits the free rotation of the lower spur gear 236 while the upper spur gear 234 is held stationary. When the air cylinder 218 is pressurized in the opposite direction so that the piston rod 228 is urged upwardly, as viewed in FIG. 2, the lower washer 240 forces the two clutch plates 232 tightly against the ends of the lower spur gear 236 trapped therebetween and forces the upper of the two clutch plates 232 tightly against the wear surface 226. This prevents rotation of the lower spur gear with respect to the clutching mechanism 206 and the drive gear 192. Concurrently, the upper clutch plates 230 and upper spur gear 234 have a small amount of axial play, not shown but similar to the space 242, between the upper flat washer and the upper of the two clutch plates 230. This permits the free rotation of the upper spur gear 234 while holding the lower spur gear 236 stationary with respect to the clutch mechanism 206. As best seen in FIG. 8, the attachment arm 208 includes a ball bearing 244 in a bore formed therein to help support the clutch mechanism 206 with respect to the drive shaft 62 and maintain rotational position of the spur gears 234 and 236 with respect to their respective gears 212 and 192. The clamp 210, as best seen in FIG. 8, has a downwardly extending flange 246 that overlaps an edge of the attachment arm 208. Screws 248 extend through clearance holes in the flange 246 and into threaded holes in the arm 208 for rigidly attaching the clamp to the arm. The clamp 210 included a bore 250 that is concentric with the ball bearing 244 and is a slip fit with the outer diameter of the hollow shaft 44. A slot 252 is formed vertically through the clamp 210 so that it intersects the bore 250. Screws 254 extend through clearance holes in one side of the clamp 210 that intersect the slot 252 and into threaded holes 256 in the other side of the clamp. The screws 254 effectively secure the clamp 210 tightly to the end of the hollow shaft 44 in the position shown in FIG. 2 so that when the hollow shaft rotates or pivots, the clutch mechanism 206 must also rotate or pivot therewith.

In operation, a wire 24 is threaded past the guide roller 140, causing it to pivot counterclockwise to the position shown in FIG. 3, along the knurled surface 74 of the drive wheel 70 and between the drive wheel 70 and the pressure wheel 124. The air cylinder 92 is actuated to cause the I-shaped member 80 to slide in the direction of the arrow 104, shown in FIG. 3, until the knurled surface 128 of the pressure roller 124 presses the wire 24 against the knurled surface 74, as shown in FIG. 5. The feed side mechanism 18 is in the position shown in FIG. 1 and the air cylinder 218 is pressurized to cause the piston rod 228 to move downwardly, as viewed in FIG. 2. This locks the upper spur gear 234 in place thereby preventing the platform 40 from pivoting out of position. The motor is then actuated to rotate the drive gear 192 in a clockwise direction, as viewed in FIG. 3 to feed a length of the wire 24 into the cutting and stripping unit 34 where the end of the wire is cut and the stripping blades closed on the insulation. It will be noted that when the wire 24 is fed in either direction it is fed by the combined frictional engagement of both knurled surfaces 74 and 128 with the wire, since the driving pulley 120 is being driven by the drive pulley 70 through the belt 132. The wire 24 is in engagement with a substantial angular portion of the knurled surface 74, in the present example about 90 degrees. As the drive wheel 70 and the pressure roller 124 rotate during feeding of the wire, the wire 24 is pulled tightly against the knurled surface 74. This provides additional friction between the wire 24 and the knurled surface 74 to minimize slipping. While the wire is in engagement with a 90 degree portion of the knurled surface, in the present example, a benefit will be obtained by using a smaller or larger angle from say about 40 degrees to about 110 degrees or larger. The motor 196 is then reversed to withdraw the cut end of the wire 24, thereby stripping the insulation therefrom. The air cylinder 218 is pressurized so that the piston rod 228 moves upwardly locking the lower spur gear 236 in place and freeing the upper spur gear 234. The motor 196 is operated to rotate the drive gear 192 counterclockwise, as viewed in FIG. 3. Since the lower spur gear is prevented from turning it must simply follow the periphery of the drive gear 192 about the axis of the drive shaft 62, carrying the entire clutch mechanism 206 and attached hollow shaft 44 along with it. The upper spur gear 234 simply rotates freely as it tracks around a portion of the gear segment 212. This causes the platform to pivot counterclockwise to the position shown in phantom lines in FIG. 1 where the end of the wire 24 is in lateral alignment with the crimping tooling of the feed side press 14 for attachment of a terminal. The end of the wire is then positioned axially with respect to the tooling as follows. The air cylinder 218 is pressurized to cause the piston rod 228 to move downwardly, as viewed in FIG. 2. This locks the upper spur gear 234 in place thereby preventing the platform 40 from pivoting out of position. The motor is then actuated to rotate the drive gear 192 in a clockwise direction, as viewed in FIG. 4 to feed the stripped end of the wire 24 into the crimping tooling and the press 14 is actuated to attach a terminal to the wire. After attachment of the terminal the air cylinder is pressurized so that the piston rod 228 moves upwardly again locking the lower spur gear 236 in place and freeing the upper spur gear 234. The motor is operated to rotate the platform 40 clockwise so that the terminated end of the wire is in alignment with the wire cutting and stripping unit 34, as shown in FIG. 1. The air cylinder 218 is then pressurized to cause the piston rod to move downwardly to lock the upper spur gear in position and allow the lower spur gear to turn freely. The motor 196 is then operated to rotate the drive gear 192 in a clockwise direction, as viewed in FIG. 4, to feed the wire 24 through the cutting and stripping unit 34 and into the eject side unit 20 a desired distance. The cutting and stripping unit 34 is operated to cut the wire 24, thereby creating a lead 30. The eject side unit 20, has a wire feed mechanism 264, as shown in FIG. 1, that is somewhat different than the wire feed mechanism 42. However, the wire feed mechanism 264 is operated in a manner similar to the mechanism 42 to pivot the cut end of the lead 30 over to the eject side press 16 for attachment of a terminal thereto. The lead 30 is then ejected into the tray 32 and the cycle is repeated any desired number of times.

While the feed side wire feed and positioning unit 18 has been described in detail above, the eject side wire feed and positioning unit 20 is similar in structure and operation, with the exception of the wire feed mechanism 264. The unit 20 utilizes a single electric motor 196, clutch mechanism 206, and gear and shaft structure 62, 44, 50, 192, and 212 in a manner identical to that of the unit 18. However, it moves the lead 30 to strip the insulation from the trailing end, positions that end of the lead with respect to the press 16 for attachment of a terminal, and then deposits the completed lead into the stacking tray 32.

Figure 9:
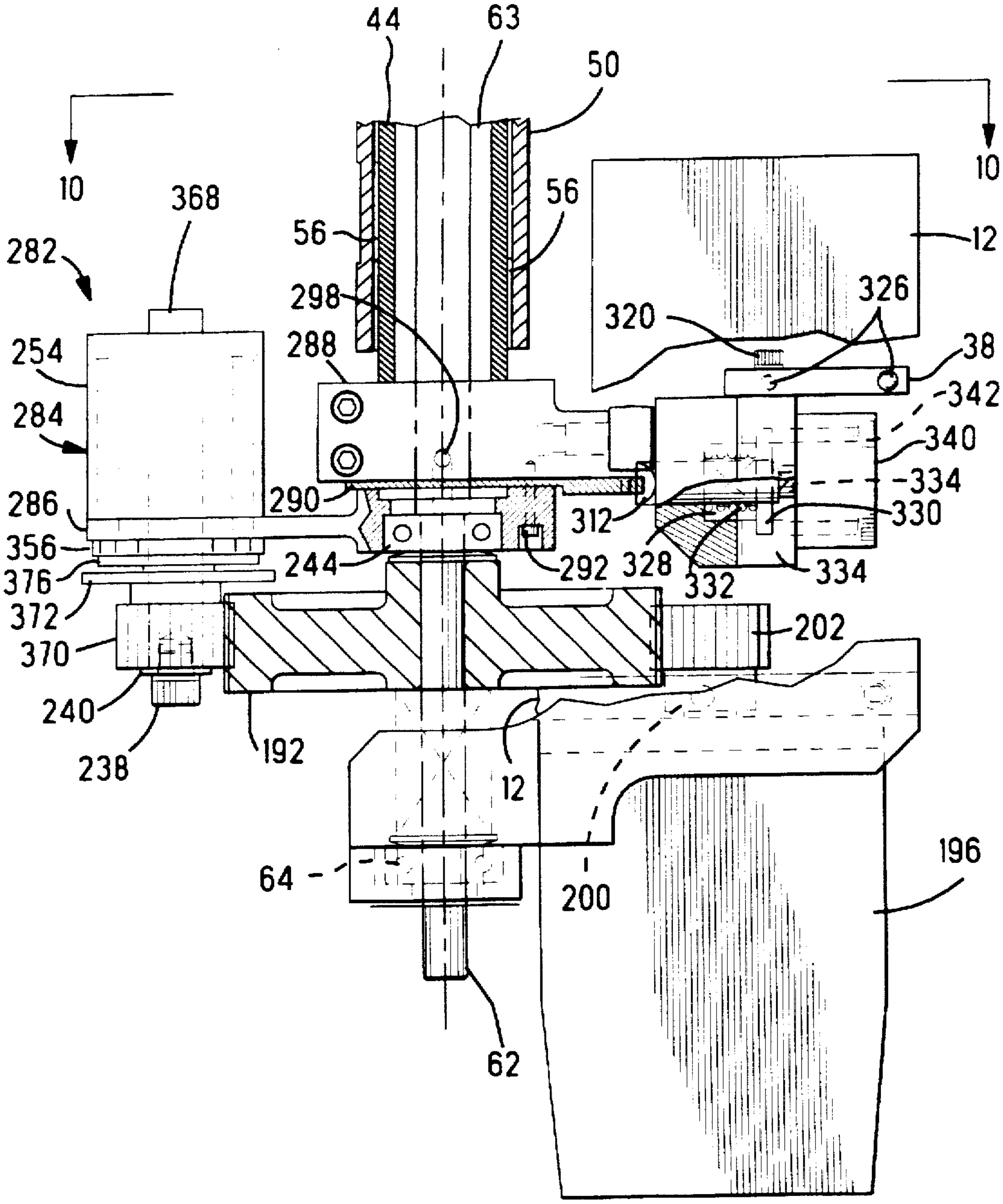
FIG. 9 is a view similar to that of FIG. 2 showing a second embodiment of the present invention.
Figure 10:
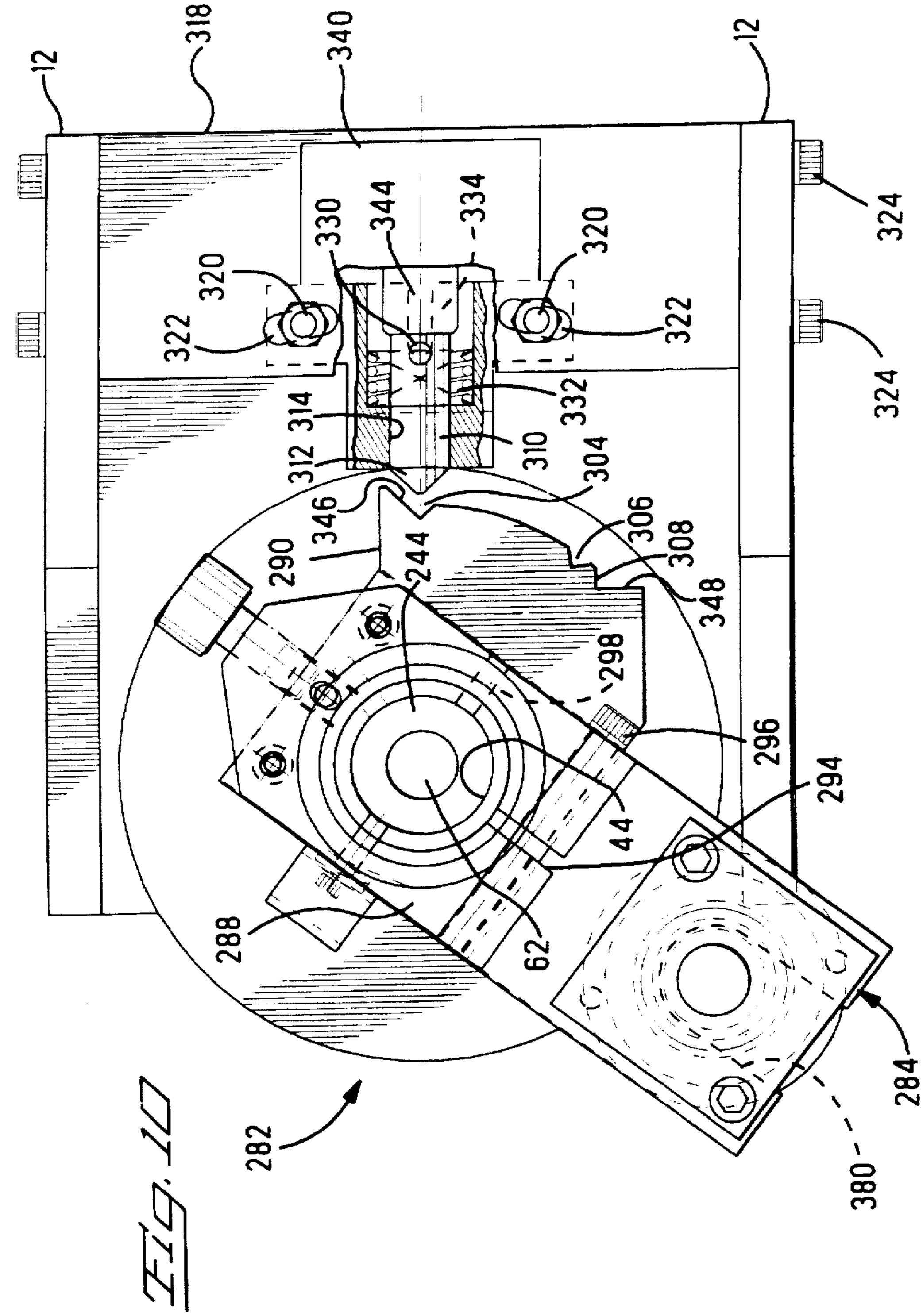
FIG. 10 is a cross-sectional view taken along the lines 10—10 in FIG. 9.

A second embodiment of the present invention will now be described with reference to FIGS. 9 through 12. Parts shown in this embodiment that are identical to or substantially similar to parts described in the first embodiment are assigned like identifying numbers. There is shown in FIG. 9 a coupling unit 282, similar to the coupling unit 204, arranged to selectively couple the output shaft 200 of the motor to drive either the wire feed wheel 70 with respect to the platform 40 or to pivot the platform 40 to position the end of the wire 24 adjacent either the cutting and stripping unit 34 or the feed side press 14. The coupling unit 282 includes a clutch mechanism 284 that is rigidly attached to the hollow shaft 44 by means of an attachment arm 286 and clamp 288. A ball bearing 244 is disposed in a bore in the attachment arm 286 and has its inner race in engagement with the drive shaft 62. A striker plate 290 is disposed between the attachment arm 286 and the clamp 288 for a purpose that will be explained. The three parts are secured together by means of screws 292 that extend through counterbored holes in the attachment arm 286, clearance holes in the striker plate 290, and into threaded holes in the clamp 288 to form a rigid assembly. The clamp 288 has a bore that closely receives the outer diameter of the hollow shaft 44. A slot 294, as best seen in FIG. 10, is formed through the clamp so that it intersects the bore. Screws 296 extend through clearance holes on one side of the slot and into threaded holes on the other side. When the screws 296 are tightened the clamp deflects slightly to tightly grip the outer surface of the hollow shaft. The clamp 288 is located on the hollow shaft 44 by means of a pin 298 that extend through a hole in the clamp and into a slot formed in the hollow shaft.

The striker plate 290, as best seen in FIG. 10, is a substantially flat plate having first, second, and third notches 304, 306, and 308, respectively, formed in an outer peripheral edge. The three notches are formed on a common radius extending from the center of the drive shaft 62. A spring loaded plunger 310 having a tip 312 is arranged to slide within a bore 314 in a holder block 316. The holder block 316 is secured to a support plate 318 by means of screws 320 that extend through elongated holes 322 in the support plate and into threaded holes in the holder block, as shown in FIGS. 9 and 10. Opposite ends of the support plate 318 are attached to two sides of the frame 12 by means of screws 324 that extend through holes in the frame and into threaded holes 326 in the ends of the support plate. The bore 314 has a counterbore 328 formed in the side of the holder block opposite the tip 312. A pin 330 extends through the plunger 310 and a compression spring 332 is disposed within the counterbore 328 so that it pushes against the pin 330 and urges the plunger toward the right, as viewed in FIGS. 9 and 10, away from the striker plate 290. The pin 330 rides in a slot 334 formed in the holder block 316 to prevent rotation of the plunger 310. An air cylinder 340 is secured to the holder block 316 by means of screws 342 that extend through holes in the air cylinder and into threaded holes in the holder block. The air cylinder includes a piston rod 344 that is in abutting engagement with the end of the plunger 310, as shown in FIGS. 9 and 10. When the air cylinder 340 is pressurized in one direction the piston rod extends, pushing the plunger 310 toward the striker plate so that the tip 312 engages one of the notches 304, 306, or 308, as shown in FIG. 9. When the air cylinder is pressurized in the other direction the piston rod retracts and the spring 332 moves the plunger 310 out of engagement with the striker plate 290 to the position shown in FIG. 10. The outer most notches 304 and 308 include stop surfaces 346 and 348, respectively, that extend far enough from the drive shaft 62 so that they will interferingly engage the tip 312 of the plunger 310 to limit rotational movement of the striker plate 290 and attached hollow shaft 44, even with the plunger in its fully retracted position shown in FIG. 10. The tip 312 is shaped to match the shape of the notches 304, 306, and 308 in the striker plate 290 so that, when the piston rod of the air cylinder is in its extended position and the tip is in one of the notches, as shown in FIG. 9, the striker plate and hollow shaft 44 are held in their present position.

Figure 11:
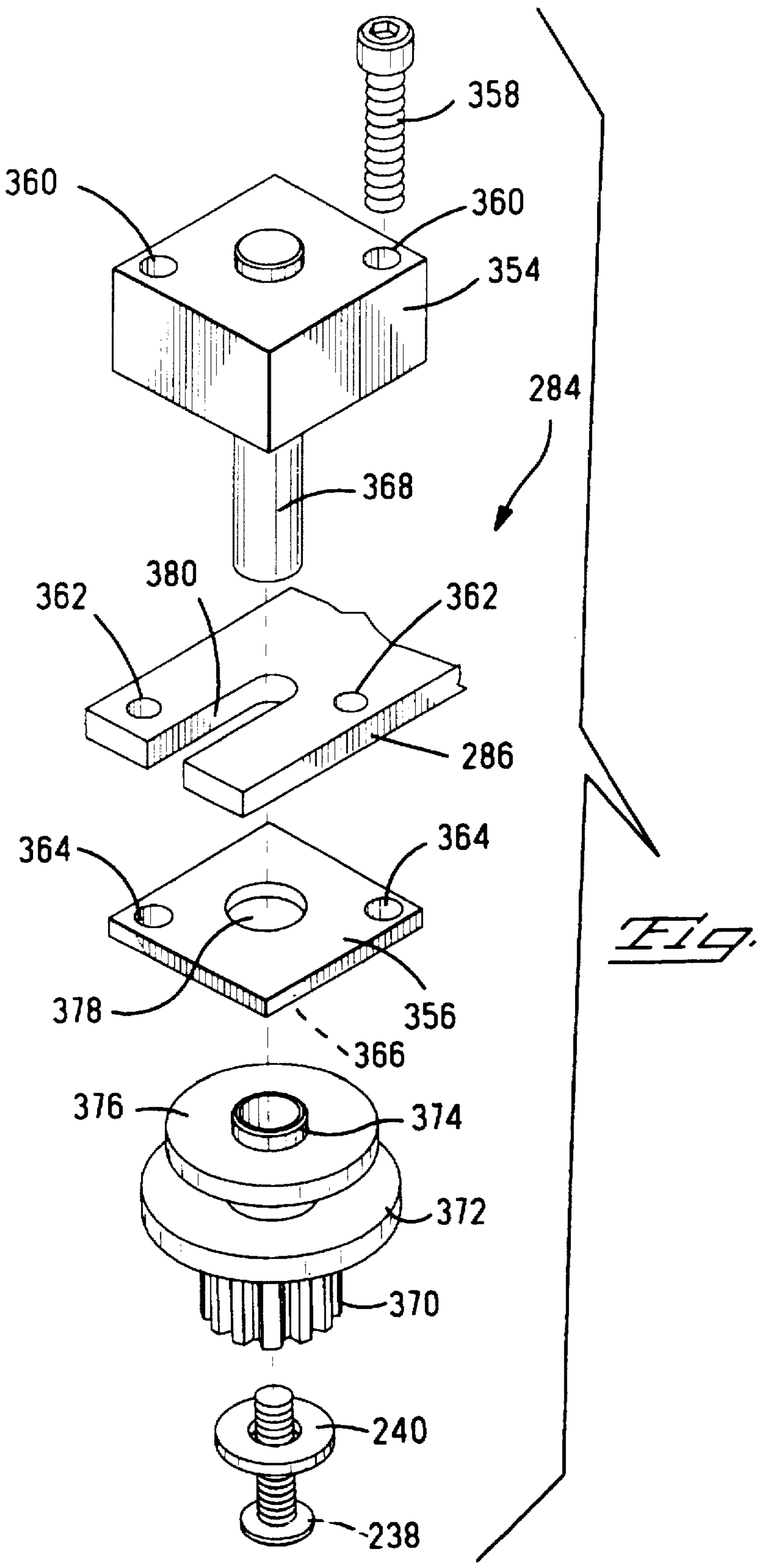
FIG. 11 is an exploded parts view of the clutch mechanism shown in FIG. 9.
Figure 12:
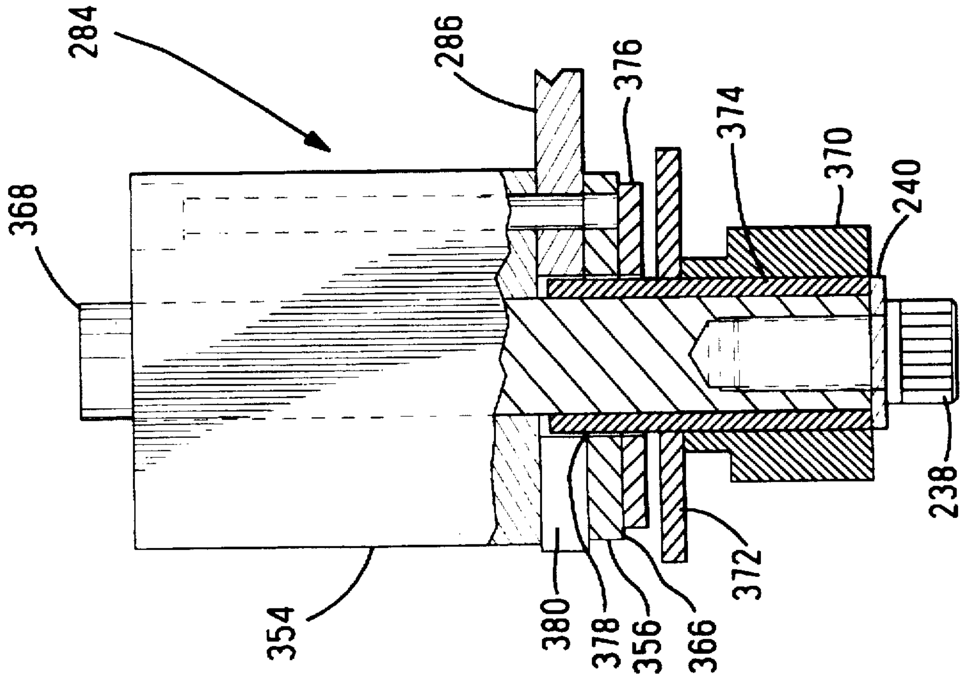
FIG. 12 is a partial cross-sectional view of the clutch mechanism shown in FIG. 9.

As best seen in FIGS. 11 and 12, the clutch mechanism 284 includes an air cylinder 354 attached to the attachment arm 286 and a wear plate 356 by means of screws 358 that extend through holes 360 in the air cylinder, holes 362 in the attachment arm, and into threaded holes 364 in the wear plate. The air cylinder 354 includes a piston rod 368 that extends downwardly from the lower end of the air cylinder. A spur gear 370 having a friction plate 372 attached to its hub by any suitable means, such as welding, includes a bushing 374 pressed into a central bore in the gear. The bushing extends outwardly from the friction plate a short distance. A clutch plate 376, in the shape of a washer, is bonded to a surface 366 of the wear plat 356 so that it will not rotate in use and possibly become deformed. The bushing is journaled for rotation on the piston rod 368 so that the spur gear and friction plate are free to rotate on the piston rod. The bushing 374 extends upwardly through a clearance hole 378 in both the clutch plate 376 and the wear plate 356 and into a clearance slot 380 formed in the end of the attachment arm 286, as best seen in FIG. 12. The spur gear 370 is held captive to the piston rod by means of a screw 238 and flat washer 240, the screw being threaded into a hole formed in the end of the piston rod 368. The spur gear 370 is in meshing engagement with the gear 192, as shown in FIG. 9. The thicknesses of the clutch plate 376, the spur gear 370 and friction plate 372 are chosen so that when the air cylinder 354 is pressurized so that the piston rod 368 is urged upwardly, as viewed in FIG. 9, the washer 240 forces the friction plate 372 tightly against the clutch plate 376. This prevents rotation of the spur gear 370 with respect to the clutching mechanism 284 and the attachment arm 286.

When the air cylinder 354 is pressurized in the opposite direction so that the piston rod 368 is urged downwardly, as viewed in FIG. 9, the spur gear 370 and attached friction plate 372 move away from the clutch plate 376 so that the spur gear is free to rotate on the piston rod 368. As set forth above, the attachment arm 286 includes a ball bearing 244 in a bore formed therein. This helps to support the clutch mechanism 284 with respect to the drive shaft 62 and maintain rotational position of the spur gear 370 with respect to the gear 192.

The operation of the machine 10 with the coupling unit 282 is similar to the operation with the coupling unit 204, except as follows. When it is desired to pivot the platform 40 by pivoting the hollow shaft 44, the piston rod 344 is retracted so that the plunger 310 is moved out of engagement with the striker plate 290. The air cylinder 354 is pressurized to retract the piston rod 368 so that the friction plate 372 engages the clutch plate 376 and prevents rotation of the spur gear 370 with respect to the attachment arm 286. The motor 196 is then activated in the manner described above to pivot the entire clutch mechanism 284 so that the attached hollow shaft 44 and platform 40 pivot to the desired position. When in the proper position, the air cylinder 340 is pressurized to extend the piston rod 344, thereby pushing the tip 312 of the plunger 310 into engagement with one of the notches 304, 306, or 308 thereby locking the platform 40 in position. When it is desired to operate the wire feed mechanism while holding the platform 40 stationary, the tip 312 of the plunger 310 is extended into engagement with the desired notch 304, 306, or 308 in the striker plate. The air cylinder 354 is then pressurized so that the piston rod 368 extends, thereby moving the friction plate 372 away from the clutch plate 376, permitting the free rotation of the spur gear on the piston rod. The motor 196 is then activated in the manner described above to rotate the drive shaft 62, thereby operating the wire feed mechanism.

Figure 13:
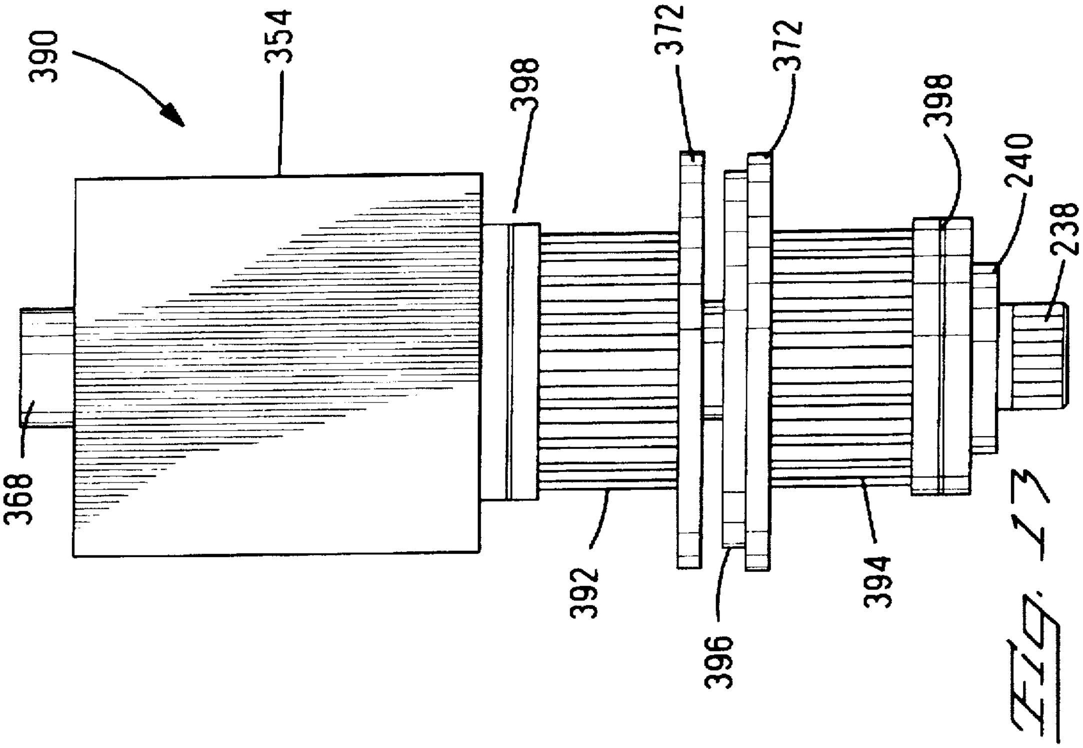
FIG. 13 is a front view of an alternative structure of the clutch mechanism.

A variation of the clutch mechanism 284 is shown in FIG. 13 and identified as clutch mechanism 390. In this case the piston rod 368 has first and second spur gears 392 and 394, respectively, journaled for rotation thereon. Each spur gear has a friction plate 372 welded to one side in a manner similar to the spur gear 370. The first and second spur gears are arranged so that their respective friction plates are mutually opposed, as shown in FIG. 13. A clutch plate 396, similar to the clutch plate 376, is bonded to the face of the friction plate 372 attached to the second spur gear 394. A thrust ball bearing 398 is disposed between the first spur gear 392 and the air cylinder 354, and another thrust ball bearing 398 is disposed between the second spur gear 394 and the washer 240. The two spur gears and the thrust bearings are held captive on the piston rod 368 by means of the screw 238 and washer 240. When the air cylinder 354 is pressurized to extend the piston rod 368, as shown in FIG. 13, the clutch plate 396 moves away from the friction plate 372 attached to the first spur gear 392, thereby permitting the two spur gears to independently rotate freely on the piston rod 368. When the air cylinder 354 is pressurized to retract the piston rod 368, the clutch plate 396 is moved into frictional engagement with the friction plate 372 attached to the first spur gear so that the two spur gears are tightly coupled together but are free to rotate as a single unit on the piston rod 368. This clutch mechanism 390 would be useful in coupling a motor to the drive shaft of a machine. In such case one of the spur gears would be coupled to the output shaft of the drive motor and the other spur gear would be coupled to the drive shaft of the machine. This would provide an inexpensive power clutching mechanism.

While the clutching mechanisms 206, 284, and 290 are described as transmitting power through gears 192, 234, 236, 370, 392, and 394, this is by way of example only. These gears may be replaced with any suitable power transmitting device such as, for example, pulleys or sprockets.

An important advantage of the present invention is that both the wire feed function and the positioning of the end of the wire with respect to the press for attaching a terminal are accomplished by a single mechanism and operated by a single rotary actuator, such as the electric motor 196. This single mechanism has the additional advantage of being substantially simpler than prior art structures and, therefore, more reliable and more cost efficient to build and maintain.

Additionally, the clutch mechanisms disclosed herein are effective and economical to manufacture. These clutch mechanisms lend themselves to other uses such as braking devices or power transmitting devices in various kinds of machinery and other rotating devices.

We claim:

1. In a machine for making electrical leads having a frame, a wire cutting and stripping unit attached to said frame, and a terminating unit attached to said frame, a wire handling mechanism for feeding electrical wire with respect to said wire cutting and stripping unit and for positioning an end of said wire with respect to both said wire stripping unit and said terminating unit comprising:

(a) a platform coupled to said frame, said platform having a wire feed mechanism and a wire outlet through which said wire is fed upon actuation of said feed mechanism, said platform being pivotable with respect to said frame between a first position wherein said wire outlet is adjacent said wire stripping unit and a second position wherein said wire outlet is adjacent said terminating unit;

(b) an outer shaft attached to said platform having a longitudinal axis and a hole through said shaft substantially parallel to said axis, said outer shaft arranged to pivot with respect to said frame and thereby pivot said platform between said first and second positions;

(c) an inner shaft extending through said hole, and upon rotation thereof with respect to said platform, arranged to effect said actuation of said feed mechanism;

(d) a single actuator attached to said frame;

(e) a coupling mechanism coupling said single actuator to both said outer shaft and said inner shaft and arranged to selectively either rotate said inner shaft with respect to said platform while holding said outer shaft stationary with respect to said frame or to pivot said outer shaft with respect to said frame while holding said inner shaft stationary with respect to said platform.

2. The machine according to claim 1 wherein said wire feed mechanism includes a feed wheel having a peripheral surface in driving engagement with said wire, said feed wheel arranged to rotate when said inner shaft rotates.

3. The machine according to claim 2 wherein said wire feed mechanism includes a pressure roller arranged to rotate when said feed wheel rotates, said pressure roller arranged to press said wire against said peripheral surface of said feed wheel during said feeding of said wire.

4. The machine according to claim 3 wherein said pressure roller is drivingly coupled to said inner shaft.

5. The machine according to claim 3 wherein said wire feed mechanism includes an idler roller adjacent both said pressure roller and said feed wheel, and a belt extending around a pulley attached to said pressure roller, a portion of a pulley attached to said feed wheel, and said idler roller, said belt being driven by said pulley attached to said feed wheel and said pulley attached to said pressure roller being driven by said belt.

6. The machine according to claim 1 wherein said outer shaft has a first end attached to said platform and a second opposite end in driven engagement with said coupling mechanism.

7. The machine according to claim 1 wherein said coupling mechanism attaches said inner and outer shafts together so that said motor rotates both said inner and outer shafts when effecting said pivoting of said platform with respect to said frame.

8. The machine according to claim 1 wherein said coupling mechanism comprises:

(a) a first gear rigidly attached to said inner shaft in driven engagement with said motor;

(b) an arm rigidly attached to said outer shaft;

(c) a second gear rigidly attached to said frame concentric with said first gear;

(d) third and fourth gears journaled for rotation in said arm, said third gear in meshing engagement with said first gear and said fourth gear in meshing engagement with said second gear; and (e) a clutch mechanism for selectively holding only said third gear stationary with respect to said arm or holding only said fourth gear stationary with respect to said arm.

9. The machine according to claim 8 wherein said clutch mechanism comprises a linear actuator having an armature that moves parallel to said inner shaft, said third and fourth gears journaled for rotation on said armature.

10. The machine according to claim 9 wherein said linear actuator is an air cylinder having a piston rod and said armature is said piston rod.

11. The machine according to claim 10 including a first pair of clutch pads on opposite sides of said third gear and a second pair of clutch pads on opposite sides of said fourth gear, arranged so that when said air cylinder is actuated in one direction said third gear is prevented from turning by its respective pair of clutch pads while said fourth gear is free to turn, and when said air cylinder is actuated in the other direction said fourth gear is prevented from turning by its respective pair of clutch pads while the third gear is free to turn.

12. The machine according to claim 11 wherein each of said first and second clutch pads has a hole therethrough and wherein said piston rod has a first portion extending from a first side of said air cylinder and a second portion extending from a second side of said air cylinder opposite said first side, said first portion extending through said first pair of clutch pads and said third gear and said second portion extending through said second pair of clutch pads and said fourth gear.

13. The machine according to claim 12 including first and second abutting members attached to said first and second portions of said piston rod, respectively, and arranged so that when said piston rod moves in one direction said first abutting member engages one of said first pair of clutch pads and forces it against said third gear, and when said piston rod moves in the opposite direction said second abutting member engages one of said second pair of clutch pads and forces it against said fourth gear.

14. The machine according to claim 13 wherein each of said first and second abutting members comprises a flat washer and a screw extending through said flat washer and into engagement with a threaded hole in said piston rod.

15. The machine according to claim 1 wherein said wire feed mechanism includes a feed wheel having a peripheral surface in driving engagement with said wire, said feed wheel arranged to rotate when said inner shaft rotates, and a pressure roller arranged to rotate when said feed wheel rotates, said pressure roller arranged to press said wire against said peripheral surface of said feed wheel during said feeding of said wire, wherein said pressure roller is drivingly coupled to said inner shaft and said wire is in engagement with an angular portion of said peripheral surface of over about 40 degrees.

16. The machine according to claim 15 wherein said angular portion is between about 70 degrees and about 110 degrees.

17. In a machine for making electrical leads having a frame, a wire cutting and stripping unit attached to said frame, and a terminating unit attached to said frame, a wire handling mechanism for feeding electrical wire and for moving an end of said wire to a first position with respect to said wire stripping unit and a second position with respect to said terminating unit comprising:

(a) a platform coupled to said frame, a wire feed mechanism attached to said platform, said platform being pivotable between said first and second positions;

(b) a hollow outer shaft attached to said platform and arranged to pivot with respect to said frame;

(c) an inner shaft extending through said hollow outer shaft, and upon rotation thereof with respect to said platform, arranged to operate said feed mechanism;

(d) a single actuator attached to said frame;

(e) a coupling mechanism coupling said single actuator to both said outer shaft and said inner shaft and arranged to selectively either rotate said inner shaft with respect to said platform while holding said outer shaft stationary with respect to said frame or to pivot said outer shaft with respect to said frame while holding said inner shaft stationary with respect to said platform.

18. The machine according to claim 17 wherein said outer shaft has a first end attached to said platform and a second opposite end in driven engagement with said coupling mechanism.

19. The machine according to claim 17 wherein said coupling mechanism attaches said inner and outer shafts together so that said single actuator rotates both said inner and outer shafts when effecting said pivoting of said platform with respect to said frame.

20. The machine according to claim 17 wherein said single actuator is a motor and said coupling mechanism comprises:

(a) a first gear rigidly attached to said inner shaft in driven engagement with said motor;

(b) an arm rigidly attached to said outer shaft and arranged to pivot therewith;

(d) a second gear journaled for rotation and coupled to said arm, said second gear in meshing engagement with said first gear; and (e) a coupling unit for selectively:

holding only said second gear stationary with respect to said first gear while permitting said arm to pivot; or holding only said arm stationary with respect to said frame while permitting said second gear to rotate with respect to said first gear.

21. The machine according to claim 20 wherein said coupling unit includes an air cylinder attached to said arm and having a piston rod, said second gear journaled for rotation on said piston rod, a clutch pad between said arm and said second gear and arranged so that when said piston rod is moved on one direction said second gear is prevented from rotating.

22. The machine according to claim 20 wherein said arm includes at least two features associated therewith, and including a plunger member coupled to said frame and selectively movable to a locked position in engagement with one of said at least two features for preventing rotation of said outer shaft, and an unlocked position away therefrom.

23. The machine according to claim 22 including a first linear actuator arranged to move said plunger member to both said locked position and to said unlocked position.

24. The machine according to claim 23 wherein said coupling unit includes a clutch mechanism comprising a second linear actuator having an armature that moves parallel to said inner shaft, said second gear journaled for rotation on said armature.

25. The machine according to claim 24 wherein said second linear actuator is an air cylinder having a piston rod and said armature is said piston rod.

* * * * *